United States Patent [19]

Linz

[11] Patent Number: 6,005,505

[45] Date of Patent: *Dec. 21, 1999

[54] FOURTH ORDER DIGITAL NOISE SHAPER CIRCUIT

[75] Inventor: Alfredo Linz, Austin, Tex.

[73] Assignee: Advanced Micro Devices, Inc., Sunnyvale, Calif.

[ * ] Notice: This patent issued on a continued prosecution application filed under 37 CFR 1.53(d), and is subject to the twenty year patent term provisions of 35 U.S.C. 154(a)(2).

[21] Appl. No.: 08/668,532

[22] Filed: Jun. 20, 1996

Related U.S. Application Data

[63] Continuation-in-part of application No. 08/333,386, Nov. 2, 1994.

[51] Int. Cl.[6] ................................................. H03M 3/00
[52] U.S. Cl. ............................................................. 341/143
[58] Field of Search ............................... 341/143; 375/25, 375/26, 27, 28

[56] References Cited

U.S. PATENT DOCUMENTS

| | | | |
|---|---|---|---|
| 5,196,850 | 3/1993 | Duffy et al. | 341/76 |
| 5,212,659 | 5/1993 | Scott et al. | 364/724.1 |
| 5,245,344 | 9/1993 | Sooch | 341/150 |
| 5,266,908 | 11/1993 | Koulopoulos et al. | 331/2 |
| 5,287,299 | 2/1994 | Lin | 364/759 |
| 5,298,900 | 3/1994 | Mauthe et al. | 341/143 |
| 5,323,157 | 6/1994 | Ledzius et al. | 341/143 |
| 5,376,936 | 12/1994 | Kerth et al. | 341/150 |
| 5,446,460 | 8/1995 | Cabler | 341/143 |
| 5,598,158 | 1/1997 | Linz . | |

OTHER PUBLICATIONS

T. Ritonieme et al., "Modelling and Performance Estimation of Sigma–Delta Modulators", IEEE, Apr. 1991, pp. 2705–2708.

"An Integrated Per–Channel PCM Encoder Based on Interpolation," Bruce A. Wooley, et al., *IEEE Transactions on Communications*, vol. COM–27, No. 2, Feb. 1979, pp. 272–277.

"Multirate Filter Designs Using Comb Filters," Shuni Chu, et al., *IEEE Transactions on Circuits and Systems*, vol. CAS–31, No. 11, Nov. 1984, pp. 913–924.

"An Economical Class of Digital Filters for Decimation and Interpolation," Eugene B. Hogenauer, *IEEE Transactions on Acoustics, Speech, and Signal Processing*, vol. ASSP–29, No. 2, Apr. 1981, pp. 155–162.

"Multirate Digital Filters, Filter Banks, Polyphase Networks, and Applications: A Tutorial," P. O. Vaidyanathan, *Proceedings of the IEEE*, vol. 78, No. 1, Jan. 1990, pp. 56–93.

"A Multistage Delta–Sigma Modulator without Double Integration Loop," Toshio Hayashi, et al., *1986 IEEE International Solid–State Circuits Conference*, ISSCC 86/Thursday, Feb. 20, 1986/California Pavilion C., THPM 14.6, pp. 182–183.

"A 3–μm CMOS Digital Codec with Programmable Echo Cancellation and Gain Setting," Paul Defraeye, et al., *IEEE Journal of Solid–State Circuits*, vol. SC–20, No. 3, Jun. 1985, pp. 679–687.

(List continued on next page.)

*Primary Examiner*—Brian Young
*Attorney, Agent, or Firm*—Skjerven, Morrill, MacPherson, Franklin & Friel, L.L.P.; Stephen A. Terrile

[57] ABSTRACT

A digital noise shaper circuit is provided which includes a signal transfer function and a noise transfer function, with associated coefficients and gain scaling factors, which ensures a predetermined frequency response, signal passband and noise stopband, and which converts a multi-bit digital signal to a 1-bit digital signal.

12 Claims, 12 Drawing Sheets

OTHER PUBLICATIONS

"A 17–bit Oversampling D–to–A Conversation Technology Using Multistage Noise Shaping," Yasuyuki Matsuya, et al., *IEEE Journal of Solid–State Circuits*, vol. 24, No. 4, Aug. 1989, pp. 969–975.

"Fourth Order Sigma–Delta Modulator Circuit For Digital Audio And ISDN Applications," T. Karema, et al., Tampere University of Technology, Finland, pp. 223–227. (no date given).

"Area–Efficient Multichannel Oversampled PCM Voice–Band Coder," Bosco H. Leung, et al., *IEEE Journal of Solid–State Circuits*, vol. 23, No. 6, Dec. 1988, pp. 1351–1357.

"Reduction of Quantizing Noise by Use of Feedback*," H. A. Spang, III, and P. M. Schultheiss, reprinted from *IRE Trans. Commun. Systems*, pp. 373–380, Dec. 1962.

"Design of Stable High Order 1–Bit Sigma–Delta Modulators," Tapani Ritoniemi, et al., Signal Processing Laboratory, Tampere University of Technology, reprinted from *IEEE Proc. ISCAS'90*, pp. 3267–3270, May 1990.

"A High in Order Topology for Interpolative Modulators for Oversampling A/D Converters," Kirk C.–H. Chao, et al., reprinted from *IEEE Trans. Circuits and Sys.*, vol. CAS–37, pp. 309–318, Mar. 1990.

"A Stereo 16–Bit Delta–Sigma A/D Converter for Digital Audio*," D. R. Welland, et al., reprinted with permission from *Journal of the Audio Engineering Society*, vol. 37, pp. 476–486, Jun. 1989.

"A Monolithic 50 KHz 16–Bit A/D–D/A Converter Using Sigma–Delta Modulation," Charles D. Thompson, et al., Digital Signal Processor Operation/Motorola, Inc. 1990 IEEE.

"A CMOS Oversampling D/A Converter with a Current–Mode Semi–Digital Reconstruction Filter," D. Su and B. Wooley, *1993 ISSCC*, vol. 36, pp. 230–231.

"Switched Capacitor Second–Order Noise–Shaping Coder," G. Lainey, et al., *Electronics Letters*, Feb. 17th, 1983, vol. 19, No. 4, pp. 149–150.

"A 16b Oversampling A/D Conversion Technology using Triple Integration Noise Shaping," Matsuya, et al., *1987 IEEE International Solid–State Circuits Conference, Digest of Technical Papers, ISSCC 87*/Wednesday, Feb. 25, 1987, pp. 48–49.

Poles and Zeros in Z Plane

1

FOURTH ORDER DIGITAL NOISE SHAPER CIRCUIT

CROSS-REFERENCE TO RELATED APPLICATIONS

This application is a continuation-in-part of application Ser. No. 08/333,386, filed Nov. 2, 1994, pending.

BACKGROUND OF THE INVENTION

1. Field of the Invention

This invention relates to a digital noise shaping circuit. More particularly, this invention relates to a fourth order digital noise shaping circuit for use in a digital-to-analog conversion circuit.

2. Brief Description of the Related Technology

Typically, digital-to-analog converter circuits (DACs) operate by a resistor/capacitor divider method, or use a sigma-delta conversion method, to convert digital signals to analog signals. Sigma-delta DACs are preferred because of their inherent feasibility to be manufactured in integrated circuits. These DACs typically create 1-bit signals from multi-bit digital input signals. This quantization, if performed by merely truncating or rounding the multi-bit signal, would introduce a large amount of noise in the signal passband, thereby destroying the signal quality. Noise shaping pushes the quantization noise out of the signal passband. Also, the 1-bit signal can be converted to an analog signal with no linearity errors.

SUMMARY OF THE INVENTION

The present invention is for a fourth order digital noise shaping circuit which takes an oversampled multi-bit input signal from the output of an interpolator circuit and converts the multi-bit signal to a 1-bit signal while shaping the quantization noise according to a high-pass function. A signal transfer function (STF) and a noise transfer function (NTF) define the operation of the noise shaper circuit.

The NTF is chosen so zeros are introduced inside the noise stopband, which is substantially equal to the signal passband, while also achieving a flat high-frequency response. Once the NTF is determined, the STF is determined. A set of feedback coefficients are used to multiply the 1-bit output signal and feed it back to earlier stages in the noise shaper circuit to achieve the proper frequency response. Another set of coefficients is used to produce local feedback around certain stages of the noise shaper. Thee coefficients are chosen to achieve equiripple quantization noise density in the passband and a flat stopband. Suitable scaling factors between stages are also used to make the circuit stable for a predetermined range of input amplitudes.

To achieve optimum efficiency, a hardware block within the digital noise shaper circuit includes two integrators and associated adders which are identically scaled. Thus, for a fourth order noise-shaper circuit, only two unique scaling factor/integrator combinations are required to perform the fourth order function, instead of four such combinations.

DETAILED DESCRIPTION OF THE PREFERRED EMBODIMENT

Figure 1:
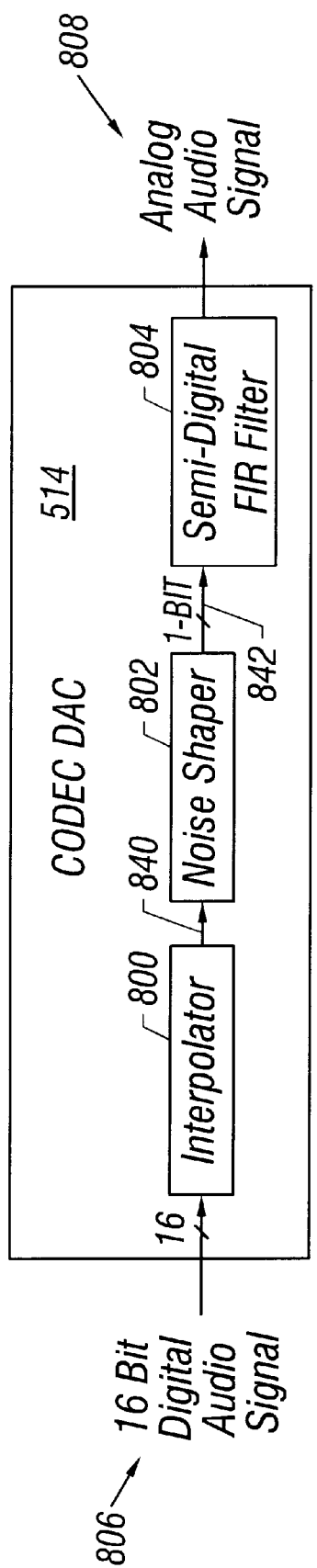
FIG. 1 is a block diagram of a digital to analog converter block utilizing the noise shaper of the present invention.

FIG. 1 illustrates a block diagram of the playback path of an audio CODEC. A suitable audio CODEC is described in application Ser. No. 08/333,467, entitled "Stereo Audio CODEC", filed Nov. 2, 1994, assigned to the common assignee of the present invention and incorporated herein for all purposes. Noise shaper 802 may be a stand-alone circuit, or may otherwise be included in an audio processing circuit, such as the audio CODEC illustrated.

Figure 2A:
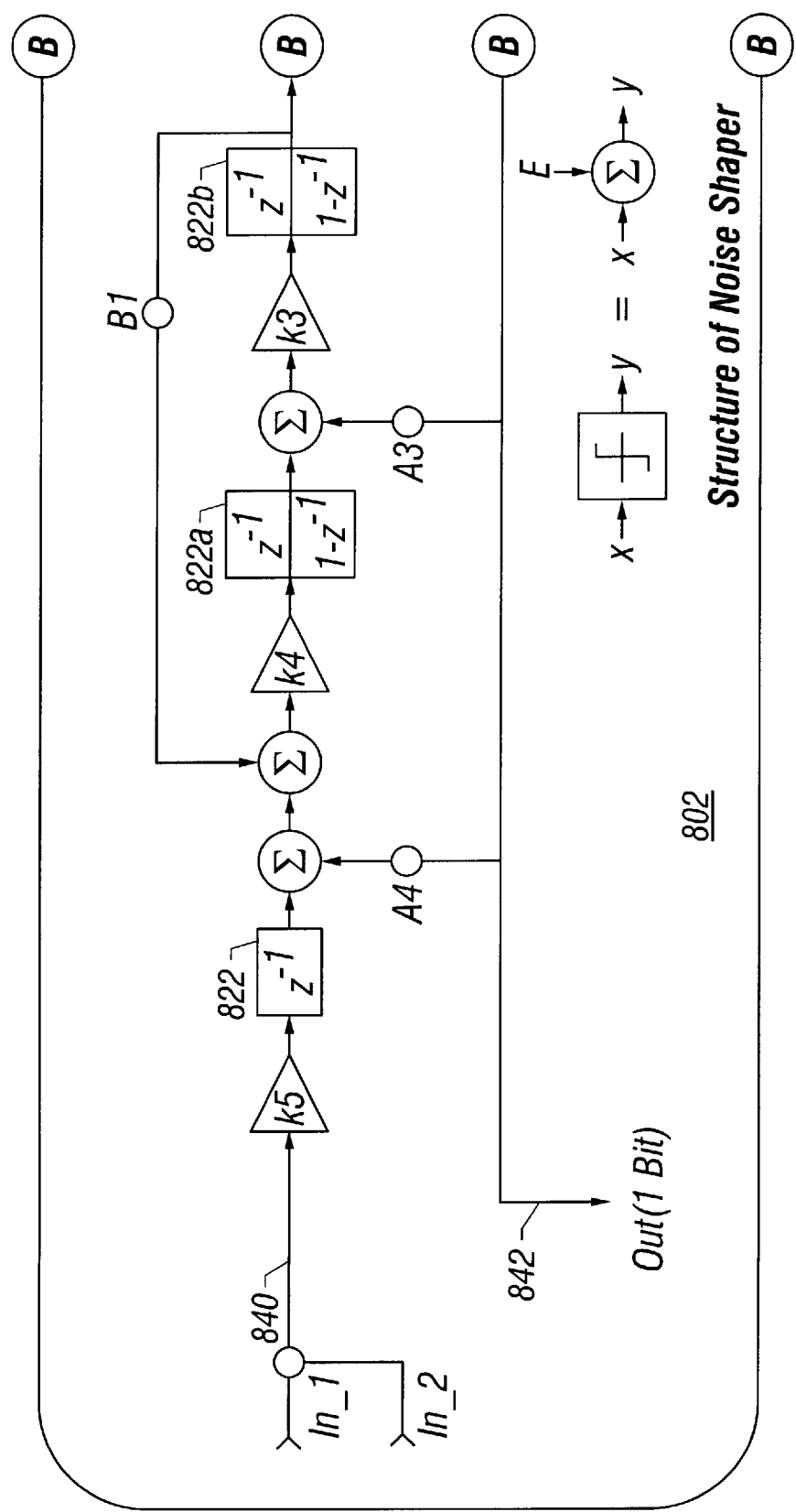
FIG. 2 is a schematic representation of the present noise shaper.
Figure 2B:
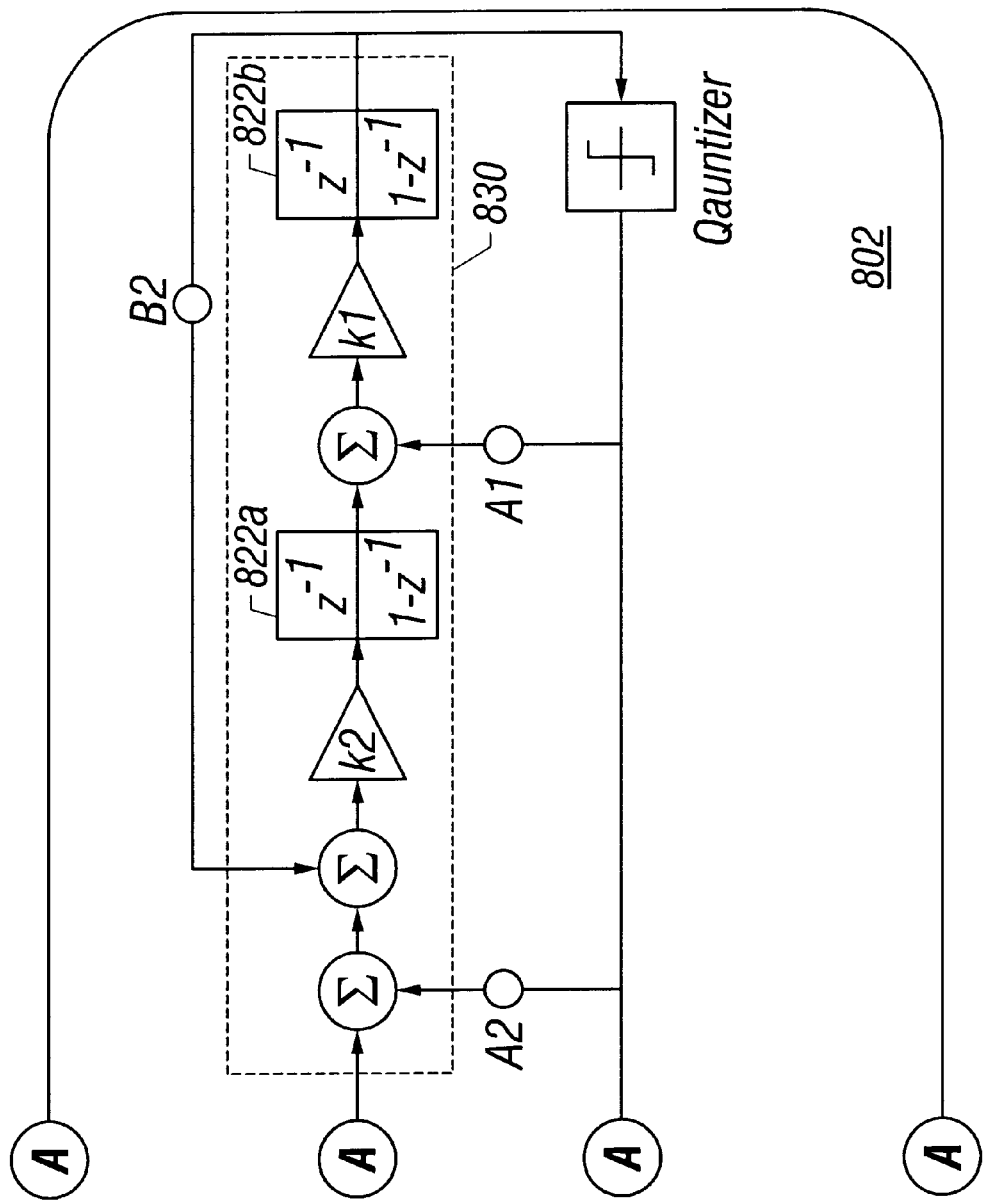

In operation, noise shaper block 802 of FIG. 2 takes at least one multi-bit audio signal, illustrated as in.1 and in.2, quantizes each respective input signal, converting the respective input signal to a 1-bit output signal while shaping the quantization noise associated with the respective signal according to a high-pass function. The block diagram implementation for the shaper 802, which is preferably a fourth order shaper, is shown in FIG. 2. The remaining description of noise shaper block 802 is directed to only one multi-bit digital input signal, although the processing of another is identical.

The 1-bit output signal 842 is input to integrators 822a and 822b. Integrators 822a and b must have suitable scaling factors on the input, to make the loop stable for a predetermined range of input amplitudes, as determined by the remainder of the digital path shown in FIG. 2. The simple additive noise model shown in FIG. 2 is used to represent the quantizer.

Two transfer functions are defined for the fourth order noise shaper circuit: a signal Transfer Function (STF) Y/X, where X is the digital audio output signal 842, and a noise Transfer Function (NTF) Y/E, where E is the quantization noise (modeled as additive, white, uniformly distributed noise). Once the NTF is fixed, the STF is also determined. Since the system is not a FIR filter, the response is no longer strictly phase-linear. The phase variation in the passband, however, is very small, on the order of about 0.011 degrees.

Figure 3:
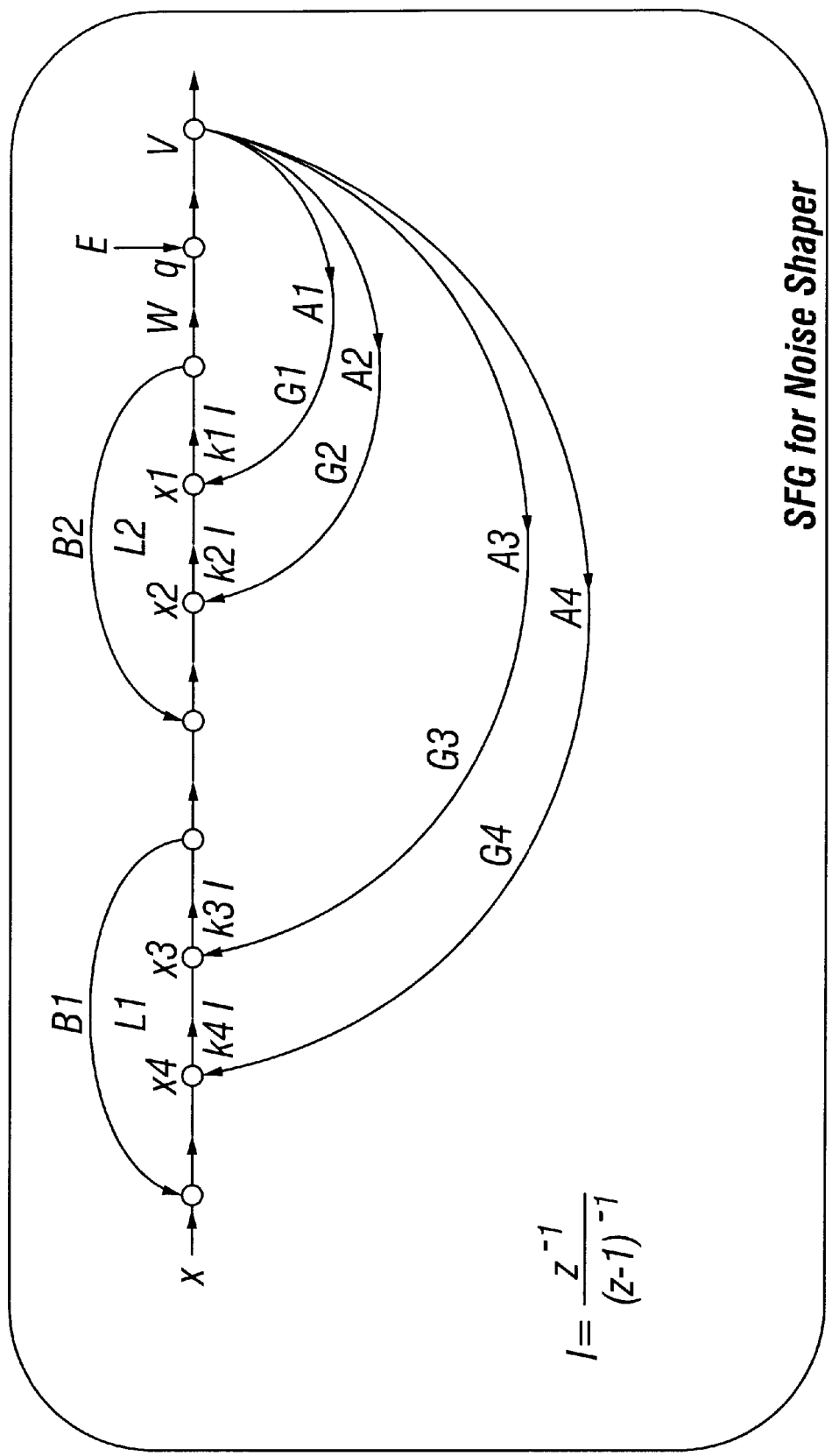
FIG. 3 is a signal flow graph (SFG) of the present noise shaper.

A signal flow graph (SFG) for noise shaper block 802 is shown in FIG. 3. The transfer functions are developed as follows:

Forward Path Gains:

The cumulative gains of all possible direct paths from input to output:

For X:

$T_1 = k_1 k_2 k_3 k_4 \cdot I^4$

For E:
$T_1=1$

Loop Gains:
The gains of all closed loops.
$G_1 = A_1 k_1 I = A_1 K_1 \cdot I$ $$G_2 = A_2 k_1 k_2 I^2 = A_2 K_2 \cdot I^2$$
$$G_3 = A_3 k_1 k_2 k_3 I^3 = A_3 K_3 \cdot I^3$$
$$G_4 = A_4 k_1 k_2 k_3 k_4 I^4 = A_4 K_4 \cdot I^4$$
$$L_1 = I^2 \cdot B_1 k_3 k_4 = B_1 \left(\frac{K_4}{K_2}\right) \cdot I^2$$
$$L_2 = I^2 \cdot B_2 k_1 k_2 = B_2 K_2 \cdot I^2$$

Non-touching Loops:
The products of the gains of sets of loops without any common nodes are calculated. First, pairs of non-touching loops have to be identified. Then, triplets are found, then sets of 4, etc. In the preferred embodiment, only pairs of non-touching loops exist.

$L_1, G_1$
$L_1, G_2$
$L_1, L_2$

Determinant:
This is defied in terms of the loop gains as $$\Delta = 1 - \Sigma \text{ loop gains} + \Sigma \text{ gains of pairs of NTL} - \Sigma \text{ of triplets of NTL} + \ldots \text{ NTL=non-touching loops}$$

In the preferred embodiment, there are no triplets of non-touching loops, so $$\Delta = 1 - \sum_{i=1}^{4} G_i - \sum_{i=1}^{2} L_i + L_1(G_1 + G_2) + L_1 L_2$$

Sub-determinants:

$\Delta_k = \Delta$ setting to zero gains of loops touching forward path k

For X:
All loops are touched by T1, so
$\Delta_1 = 1$

For E:
$\Delta_1 = 1 - L_1 - L_2 + L_1 L_2$

The transfer functions can then be constructed for X and E using Mason's rule, where $$TF = \frac{1}{\Delta} \sum_k T_k \Delta_k$$

The transfer functions have the form:

$$H_E(z) \equiv \frac{Y(z)}{E(z)} = \frac{1}{D}\left\{(1-z^{-1})^4 - \left(B_1 \frac{K_4}{K_2} + B_2 K_2\right) z^{-2}(1-z^{-1})^2 + (B_1 B_2 K_4) z^{-4}\right\}$$

$$= \frac{1}{D}\{(1-z^{-1})^4 - 2C_1 z^{-2}(1-z^{-1}) + C_2 z^{-4}\}$$

for noise, and $$H_X(z) \equiv \frac{Y(z)}{X(z)} = \frac{1}{D}$$

for the signal, where $$D = (1-z^{-1})^4 + \sum_{k=1}^{4} W_k \cdot (z^{-k}(1-z^{-1}))^{4-k}$$

Where, referring to FIG. 2, $$W_1 = -A_1 K_1$$
$$W_2 = A_2 K_2 - B_1\left(\frac{K_4}{K_2}\right) - B_2 K_2$$
$$W_3 = -A_3 K_3 + A_1 B_1\left(\frac{K_1 K_4}{K_2}\right)$$
$$W_4 = -A_4 K_4 + A_2 B_1 K_4 + B_1 B_2 K_4$$

The coefficients are chosen to match a Chebyshev function, which yields equiripple quantization noise in the passband and a flat stopband. The values for Ai and the Bi are obtained from the Ci and Wi in the above equations by matching the NTF to the desired shaping function.

Preferably, a function is chosen for the NTF which has zeros equally spaced inside the noise stopband (i.e., the signal band), and a flat high-frequency response. For the preferred embodiment, the stopband edge, the stopband attenuation and the filter order must be determined. Since the stopband attenuation is preferably at least 88 dB and the stopband edge is about 4 KHz for an input sampling rate of 8 KHz, or equivalently, about 24 KHz at the maximum sampling rate of 48 KHz, the filter order preferred is four.

First, the continuous time zeros and poles are obtained, where tie zeros are given by:

$$sz_m := j \cdot \omega_r \cdot \cos\left[(2 \cdot m + 1)\frac{\pi}{2 \cdot N}\right]$$

and the poles by:

$$sp_m := j \cdot \omega_r \cdot \left[\cosh\left(\frac{a\sinh(\epsilon 1)}{N}\right) \cdot \cos\left[(2 \cdot m + 1) \cdot \frac{\pi}{2 \cdot N}\right] + j \cdot \sinh\left(\frac{a\sinh(\epsilon 1)}{N}\right) \cdot \sin\left[(2 \cdot m + 1) \cdot \frac{\pi}{2 \cdot N}\right]\right]$$

where N=4, m ranges from 0 to 3, $\omega_r$=stopband edge= $2\pi \cdot 24000$ at $f_s=48$ KHz, or 4 KHz at $f_s=8$ KHz, and $\epsilon 1$ is related to the attenuation G given in dB by:

$$\epsilon 1 := \sqrt{10^{\frac{-G}{10}} - 1}$$

Figure 4:
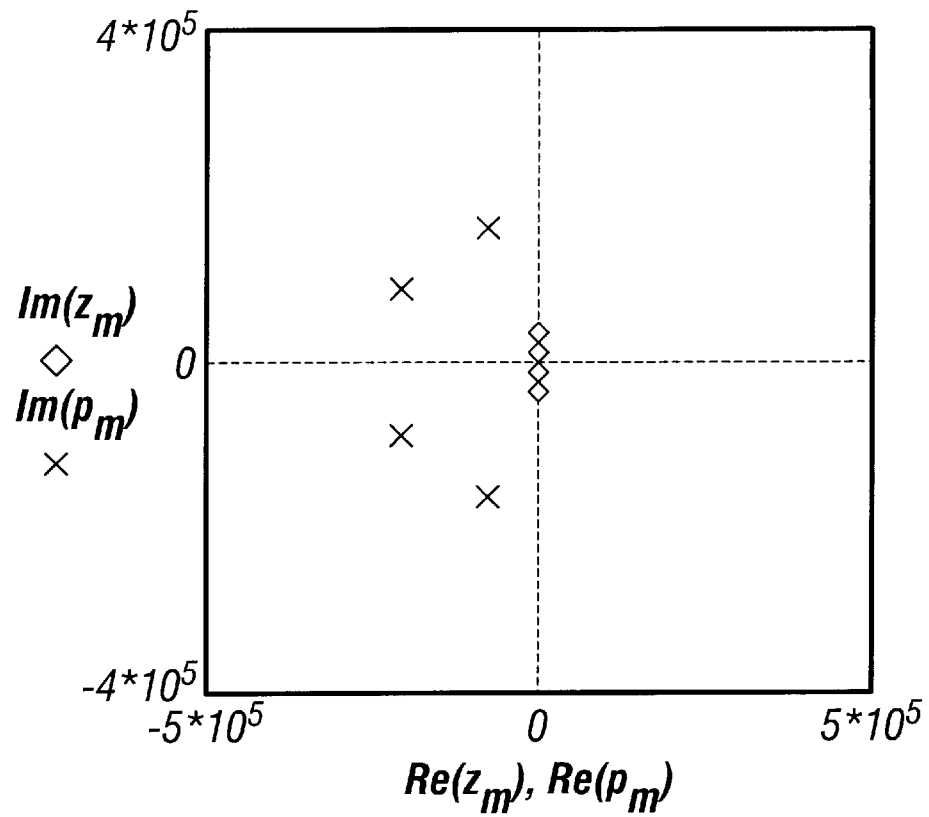
FIG. 4 is a plot of the poles and zeros in the s plane for the present noise shaper.
Figure 5:
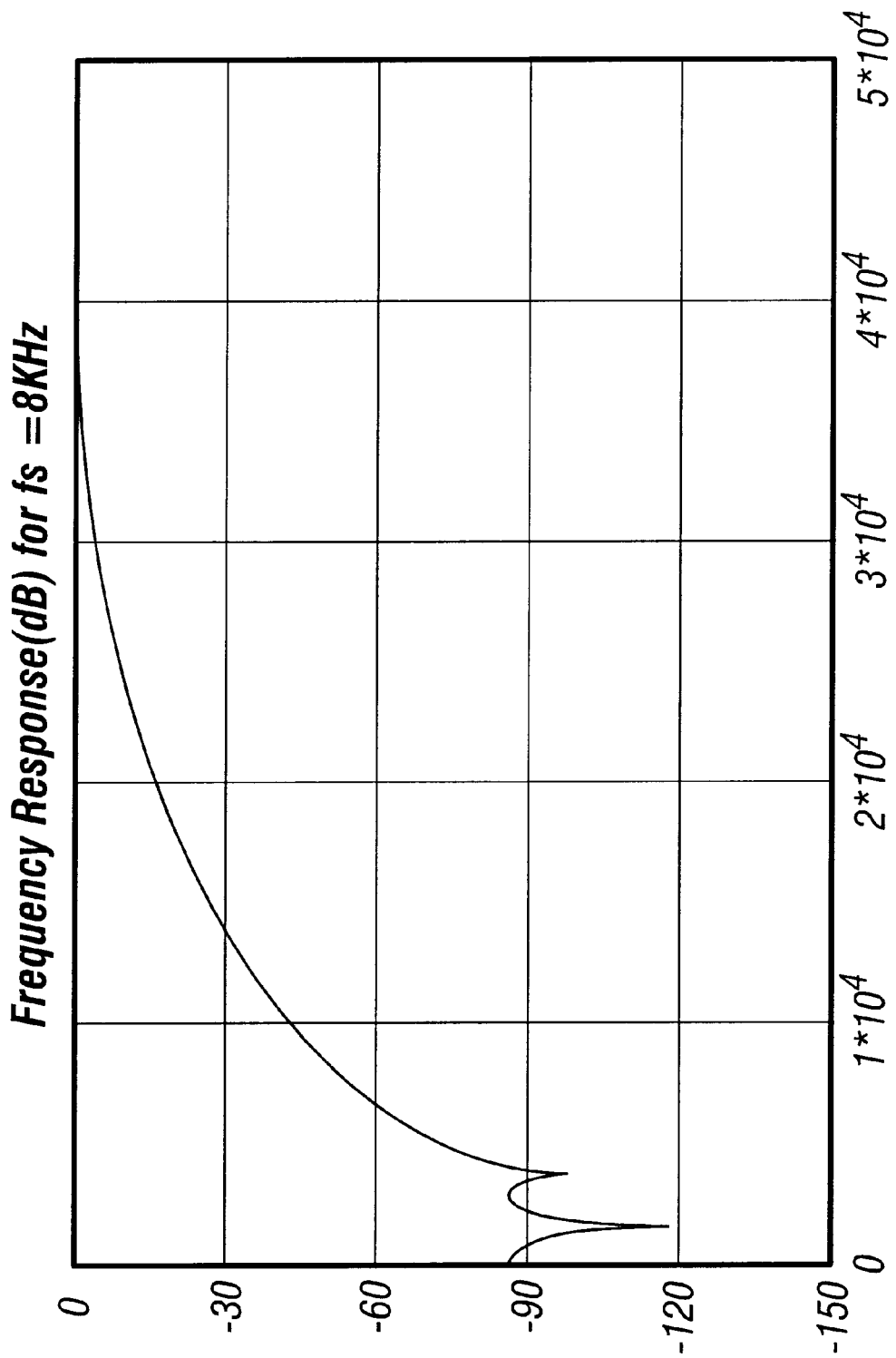
FIG. 5 is a plot of the noise transfer function magnitude of the present noise shaper.

The pole-zero diagram in the s-plane is shown in FIG. 4. A plot of the frequency response out to 50 KHz is shown in FIG. 5, for $f_s=8$ KHz. Next, the discrete zeros and poles are obtained using the bilinear transformation:

$$zz_k := \frac{1 + \frac{T}{2} \cdot sz_k}{\left(1 - \frac{T}{2} \cdot sz_k\right)}$$

$$zp_k := \frac{1 + \frac{T}{2} \cdot sp_k}{\left(1 - \frac{T}{2} \cdot sp_k\right)}$$

$$k = 0, \ldots 3$$

where $T = 1/f'_s$, and $f'_s = 64 \times f_s = 512$ KHz, for $f_s = 8$ KHz, where $f_s$ is the sampling rate of audio signal 806 and $f'_s = 64 \times f_s$ is the sampling rate of interpolated signal 840. This is the highest sampling rate at which the noise shaper 802 will operate, and corresponds to an oversampling factor of 64 times the highest sampling rate for the input signal. It should be understood, however, that the noise shaper will be operated at other (lower) sampling rates.

Solving these equations yields:

$$zz = \begin{bmatrix} 0.99897218 + 0.045327524\,i \\ 0.999823579 + 0.018783272\,i \\ 0.999823579 - 0.018783272\,i \\ 0.99897218 - 0.045327524\,i \end{bmatrix}$$

$$zp = \begin{bmatrix} 0.822884455 + 0.290464849\,i \\ 0.704668491 + 0.102984636\,i \\ 0.704668491 - 0.102984636\,i \\ 0.822884455 - 0.290464849\,i \end{bmatrix}$$

Figure 6:
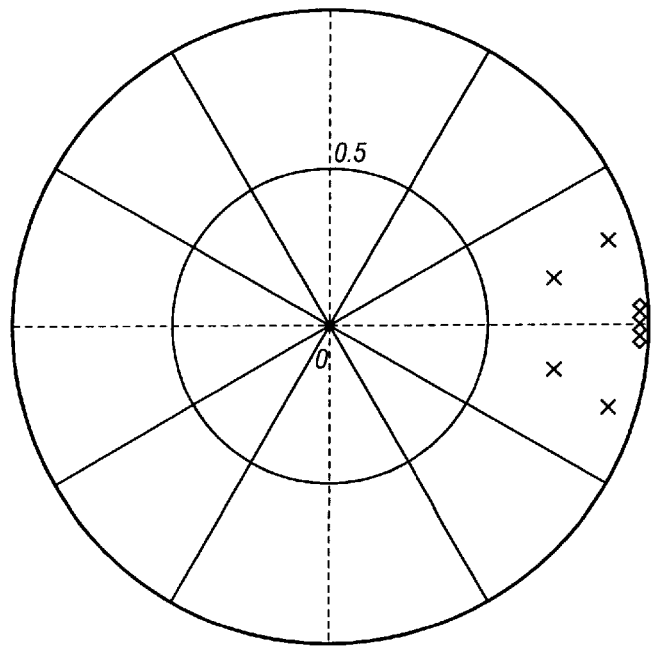
FIG. 6 is a plot of the poles and zeros in the z plane of the present noise shaper.

FIG. 6 gives the pole-zero diagram in the z-plane for noise shaper 802.

$$K := \frac{\left[\prod_{k=0}^{N-1}(-1 - zz_k)\right]}{\left[\prod_{k=0}^{N-1}(-1 - zp_k)\right]}; \quad K = 1.609121571$$

Figure 7:
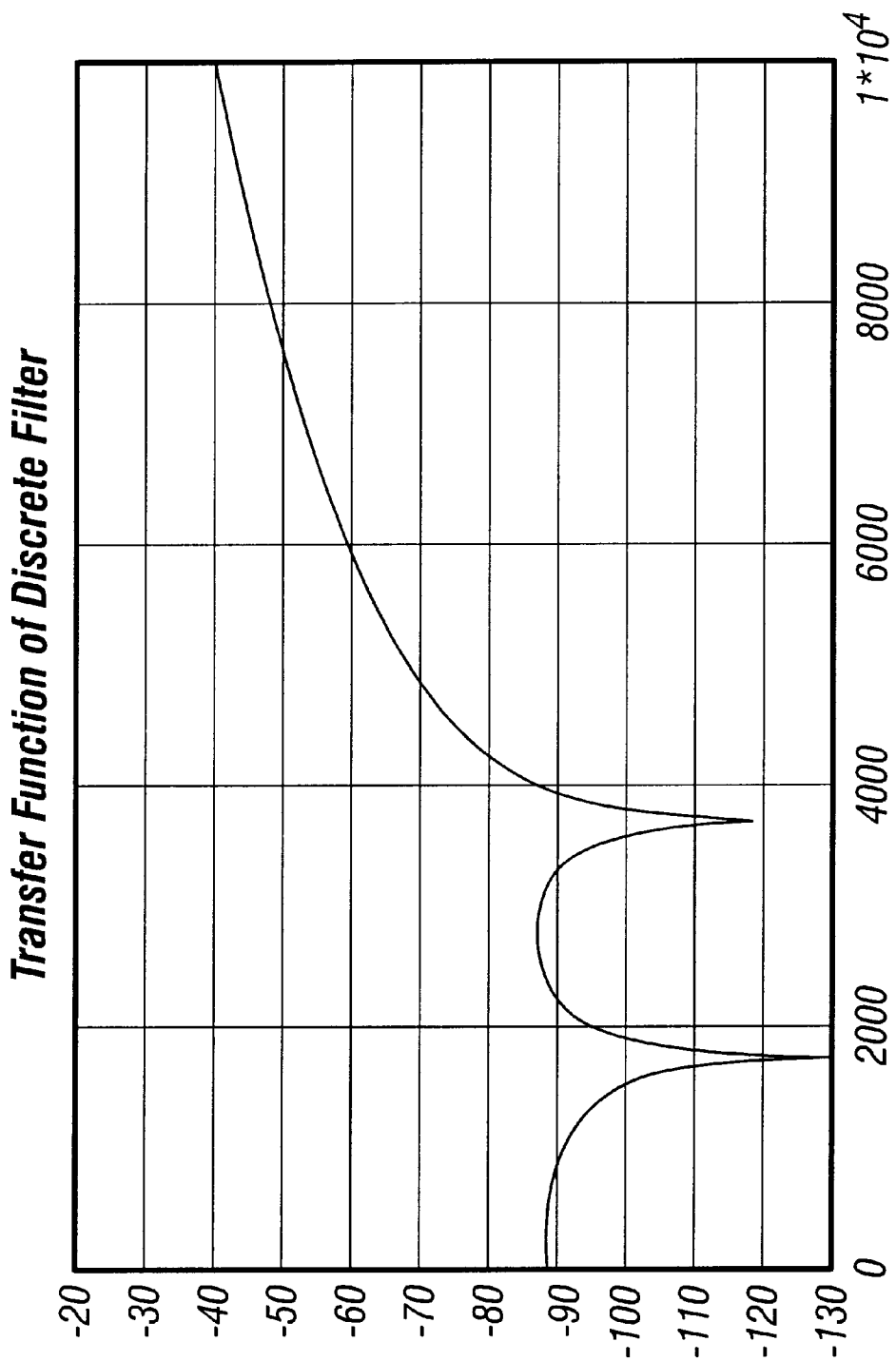
FIG. 7 is a graph of the noise transfer function, in the 0–10 KHz range, of the present noise shaper.

K is the gain of the NTF at $f = f_s/2$ (or $z = -1$) and is an important parameter for stability. The preferred frequency response of the discrete filter for noise shaper 802 is shown in FIG. 7.

The numerator in the transfer function of the selected structure must be matched to the discrete filter. The nature of the zeros that can be realized with it are found by equating the numerator of the NTF to zero, producing:

$$[(z-1)^4 - 2C_1(z-1)^2 + C_2] = 0$$

C1, C2 are not independent because they are related to B1, B2 as specified by the NTF equation, previously described. The solution yields the four roots, as follows:

$$z_{1,2} = 1 \pm \sqrt{B_1 \frac{K_4}{K_2}} \quad z_{3,4} = 1 \pm \sqrt{B_2 K_2}$$

The structure shown in FIGS. 2 and 3 allows two pairs of complex zeros, both of which have real parts equal to 1. This means they cannot be on the unit circle. However, if their angles are small enough, they will still provide enough attenuation. To actually be able to have zeros on the unit circle, more feedback loops (i.e., more coefficients) must be used.

Figure 8:
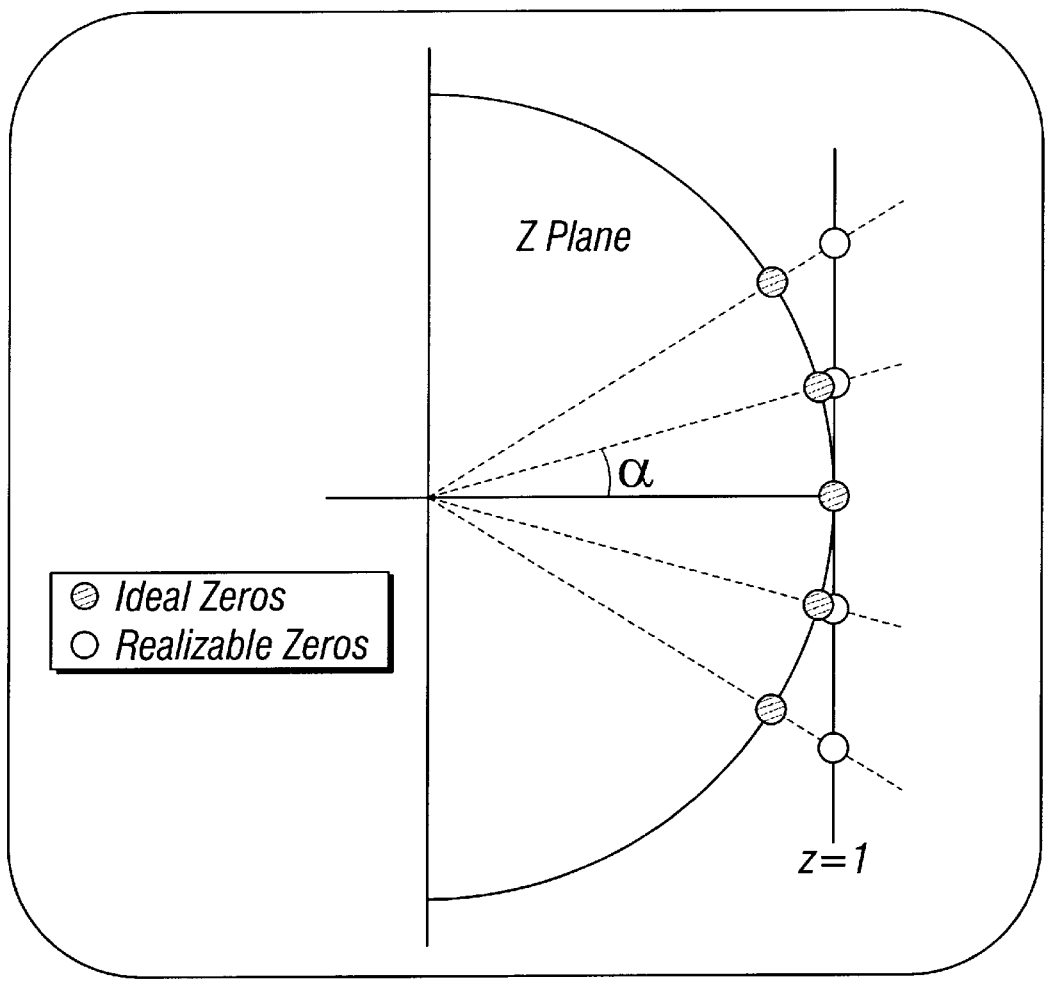
FIG. 8 is a plot of the ideal and realizable zeros of the present noise shaper.

B1, B2 are selected so that preferably the zeros have the same angles as those required by the ideal transfer function. This is shown in FIG. 8, where the angles are exaggerated.

B1, B2 are then selected to be negative, in which case the angle, $\alpha$, of the respective zero is:

$$\alpha_{1,2} = \tan^{-1}\left(\sqrt{B_1 \frac{K_4}{K_2}}\right)$$

$$\alpha_{3,4} = \tan^{-1}\left(\sqrt{B_2 K_2}\right)$$

The values of B1, B2 also depend on the values of K2 and K4. In general, the scaling coefficients k, shown in FIG. 2 as $k_1$–$k_5$, should be adjusted so noise shaper 802 is stable for the desired range of amplitudes for the input signals. Preferably, this is accomplished with the following criteria in mind:

The scaling coefficients, k, are equal for the first and third integrators 822*a* (FIG. 2) and also for the second and fourth integrators 822*b*. This permits re-utilization of one hardware block 830 containing two integrators 822*a* and *b* and associated adders 848 without having to change scaling coefficients, k. Hardware block 830 is enclosed inside the dotted line in FIG. 2.

The scaling coefficients, k, are only negative powers of two, so only hardwired shifts are used, without multiplication.

The scaling coefficients, k, equalize the signal range at the integrator 822*a* and *b* outputs so the required word width is uniform. throughout the structure.

The scaling coefficients, k, set the stability range to be compatible with the desired input signal levels.

The scaling coefficients obtained for an input signal range of +/−1.4 preferably, are:

$k_1 = 0.25$ $k_2 = 0.5$ $k_3 = 0.25$ $k_4 = 0.5$ $k_5 = 0.25$

The feedback coefficient values B1 and B2, for positioning the zeros, are obtained using these scaling factors and preferably are:

B1 = −0.016470516 (quantized to $\frac{1}{64}(1 + \frac{1}{32}) = -0.01611328$)

B2 = −0.002823487 (quantized to $\frac{1}{256}(1 - \frac{1}{4}) = -0.002929688$)

The coefficients for denominator D in the NTF equation, $H_E(z)$, above, are obtained by matching the terms in equal powers of z in the equation:

$$D = (1 - z^{-1})^4 + \sum_{k=1}^{4} W_k \cdot z^{-k} \cdot (1 - z^{-1})^{4-K}$$

with the denominator D of the discrete filter to obtain the Wi values, shown above, and then, working through the equations given, together with the values of B1 and B2. In this embodiment, for FIG. 2, a unique solution exists. The preferred feedback coefficients $A_1$–$A_4$, for positioning the poles, are:

$A_1 = -4.724470536$ $A_2 = -4.204171137$ $A_3 = -4.04452877$ $A_4 = -0.837991461$

These feedback coefficients can be quantized to 10 bits, before the STF begins to be affected inside the signal band, where:

$A_1 = -4.71875$
$A_2 = -4.203125$
$A_3 = -4.03125$
$A_4 = -0.828125$

Figure 9:
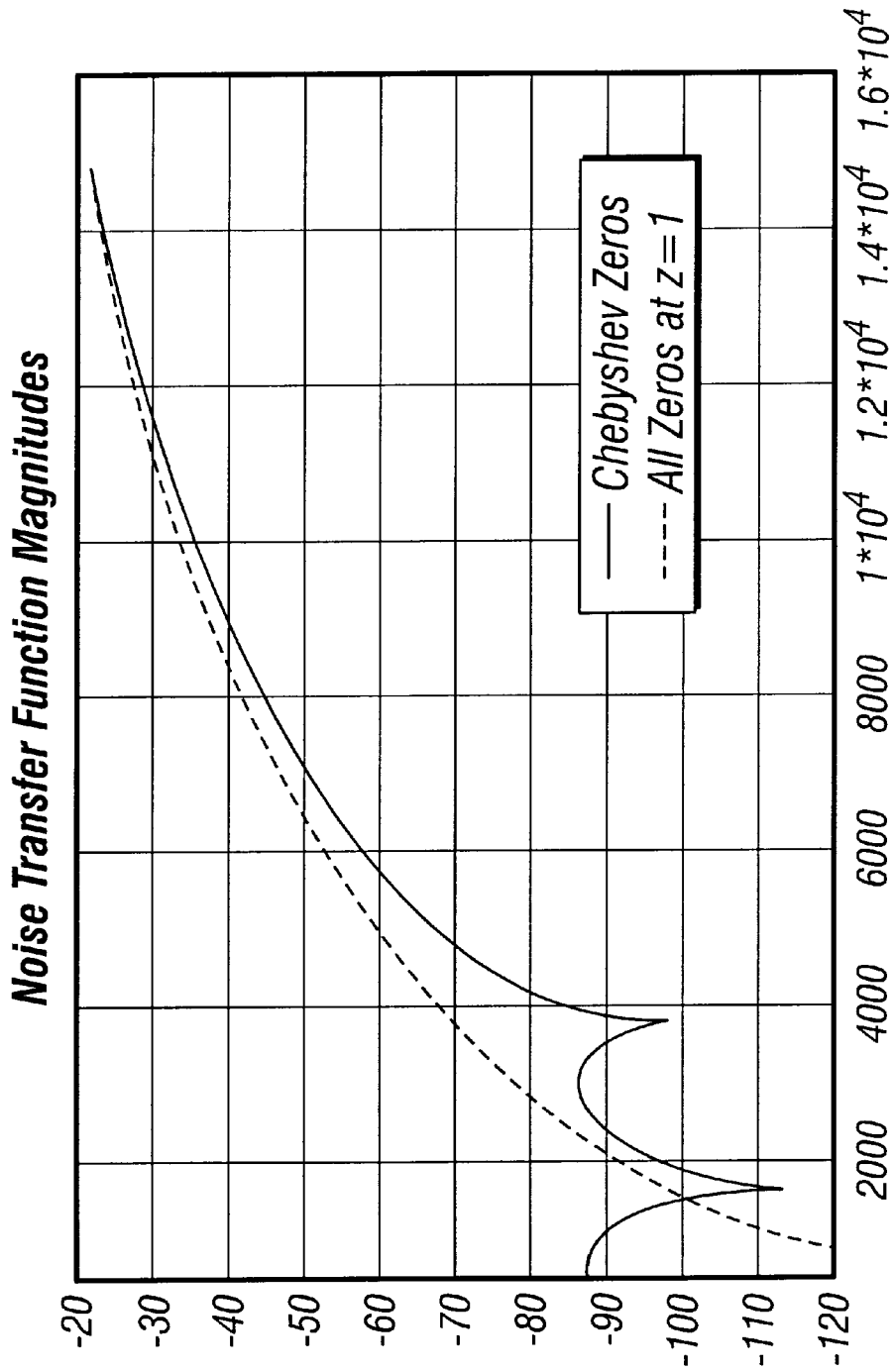
FIG. 9 is a plot comparing two embodiments of noise transfer functions.

The actual NTF magnitude is compared in FIG. 9 with the magnitude of a NTF obtained placing all the zeros at DC (z=1). It can be seen that the noise power in the signal band is about 11.7 dB less in the selected structure, using Chebyshev zeros, than it is in the simpler one with all zeros at DC.

Signal Transfer Function (STF) For Noise Shaper

Figure 10:
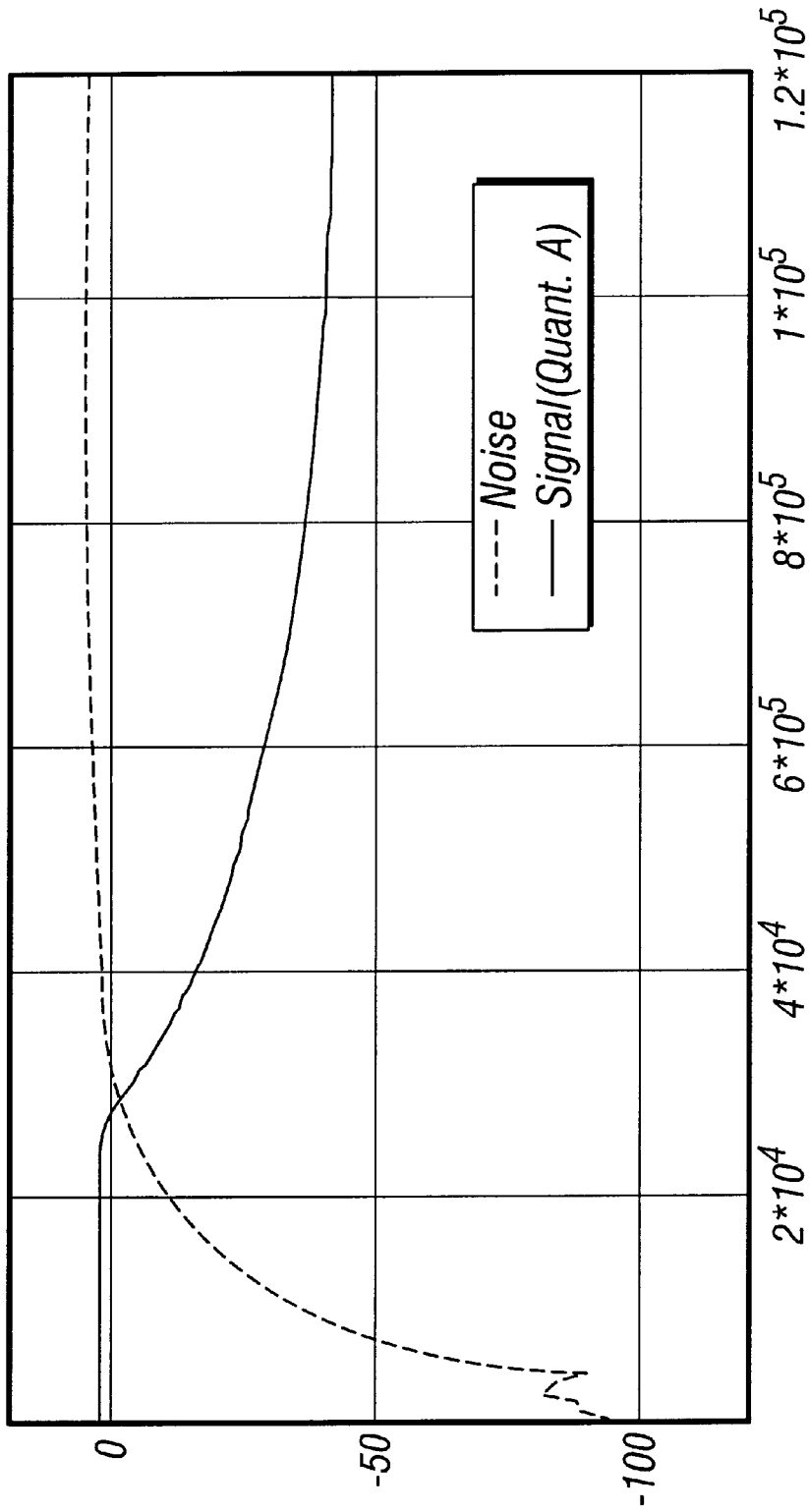
FIG. 10 is a plot of the noise and signal transfer functions of the noise shaper.
Figure 11:
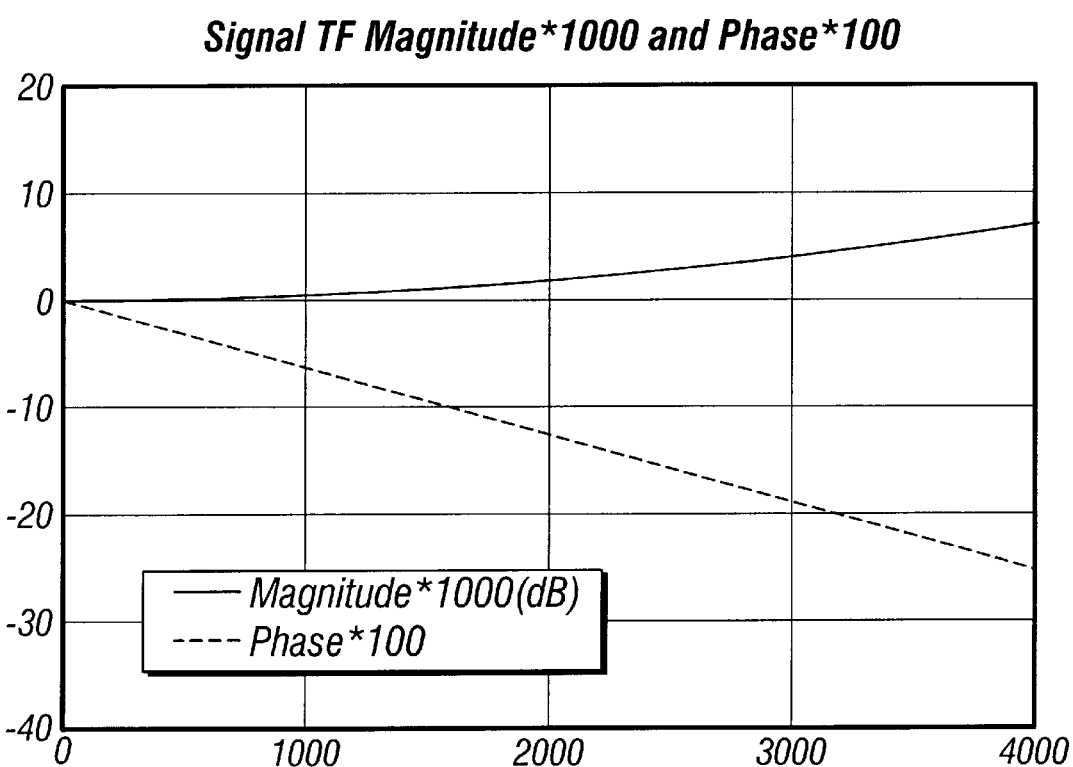
FIG. 11 is a plot of the signal transfer function magnitude and phase in the passband of the noise shaper.
Figure 12:
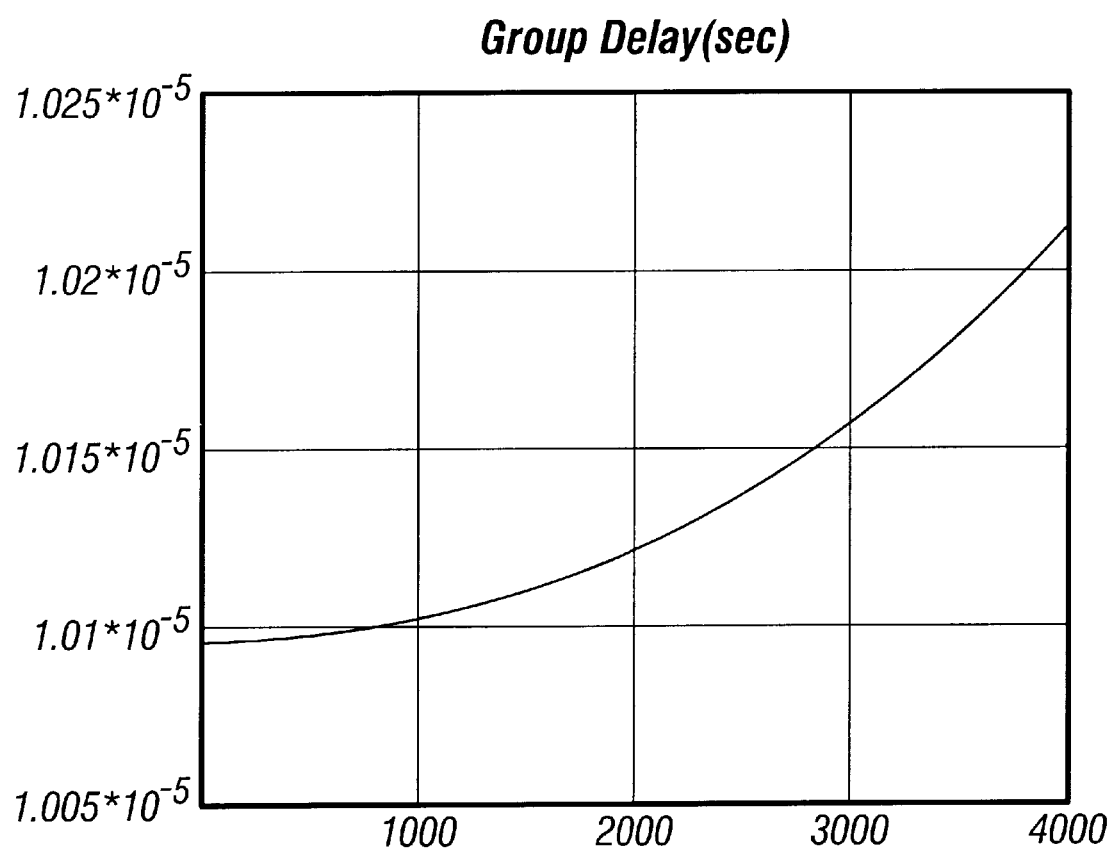
FIG. 12 is a graph of the group delay (sec.) of the noise shaper.

Once the feedback coefficients, A; B; shown in FIG. 2 have been determined, the STF for noise shaper 802 is fixed. If the oversampling ratio is large enough, the STF will have little effect inside the signal band. Otherwise, the poles can be tweaked to some extent, but this is not desirable. because stability may be compromised. A better embodiment is to compensate for any distortion in the interpolation block 800 (FIG. 1). The magnitudes of the STF and the NTF are shown in FIG. 10 over the entire frequency range. The preferred STF response in the passband appears in more detail in FIG. 11. The group delay inside the passband is shown in FIG. 12.

The passband tilt, if significant enough to violate the preferred ripple requirement for the entire playback path, can be compensated, preferably in interpolator 800. With regard to group delay distortion, however, it is still acceptable.

The difference between maximum and minimum group delay values is about 111.6 ns. The phase deviation from linear at 3.6 KHz with $f_s$=8 KHz is equal to:

$$\Delta\Phi = 360° \frac{\left(\frac{\partial\theta}{\partial\omega}\bigg|_{\omega=0} \cdot \omega_b - [\theta(\omega_b) - \theta(O)]\right)}{2\pi}$$

$$= 360° \frac{(-gd[O] \cdot \omega_b - \theta(\omega_b))}{2\pi}$$

$$\approx 0.011°$$

The foregoing disclosure and description of the invention are illustrative and explanatory of the preferred embodiments, and changes in the size, shape, materials and individual components, elements, connections and construction may be made without departing from the spirit of the invention.

What is claimed is:

1. A 1-bit noise shaper circuit, comprising:
   a fourth order sigma-delta modulator network having a quantizer and a plurality of feedback paths, wherein said sigma-delta modulator network includes a plurality of integrators, wherein each sad integrator includes an input, wherein said input of each said integrator is connected to a separate one of said feedback paths, wherein each such feedback path provides a 1-bit feedback signal which is output from said quantizer, and wherein a plurality of multi-bit digital signals input to said noise shaper circuit are converted to a 1-bit digital output signal.

2. A 1-bit noise shaper circuit, comprising:
   a fourth order sigma-delta modulator network having a plurality of feedback paths, wherein said sigma-delta modulator network includes a plurality of integrators, wherein each said integrator includes an input, wherein said input of each said integrator is connected to a separate one of said feedback paths, and wherein a multi-bit digital signal input to said noise shaper circuit is converted to a 1-bit digital output signal, wherein said circuit has a signal transfer function of:

$$H_x(z) = H_{NSS}(z) = \frac{Y(z)}{X(z)} = \frac{1}{D},$$

$$D = (1 - z^{-1})^4 + \sum_{k=1}^{4} W_k \cdot (z^{-k}(1 - z^{-1}))^{4-k}, \text{ where for Wk,}$$

$$W_1 = -A_1 K_1$$

$$W_2 = A_2 K_2 - B_1\left(\frac{K_4}{K_2}\right) - B_2 K_2$$

$$W_3 = -A_3 K_3 + A_1 B_1\left(\frac{K_1 K_4}{K_2}\right)$$

$$W_4 = -1_4 K_4 + A_2 B_1 K_4 + B_1 B_2 K_4,$$

wherein $A_{1-4}$ are pole positioning feedback coefficients, $B_{1-4}$ are zero positioning feedback coefficients, and $K_{1-4}$ are scaling factors.

3. The 1-bit noise shaper circuit of claim 1, wherein said 1-bit output signal includes a phase variation of no greater than about 0.011 degrees.

4. The 1-bit noise shaper circuit of claim 1, wherein said circuit includes a stopband noise edge of about $f_s/2$ when the sampling rate of said multi-bit digital input signal is $f_s$.

5. The 1-bit noise shaper circuit of claim 1, wherein said circuit includes a stopband noise edge of about 4 KHz when the sampling frequency of said multi-bit digital input signal is about 8 KHz, and a stopband noise edge of about 24 KHz when the sampling frequency of said multi-bit digital input signal is about 48 KHz.

6. A 1-bit noise shaper circuit, comprising:
   a fourth order sigma-delta modulator network having a plurality of feedback paths, wherein said sigma-delta modulator network includes a plurality of integrators, wherein each said integrator includes an inputs, wherein said input of each said integrator is connected to a separate one of said feedback paths, and wherein a multi-bit digital signal input to said noise shaper circuit is converted to a 1-bit digital output signal, whereby said circuit includes the following discrete zeros and poles:

$$zeros = zz_k := \frac{1 + \frac{T}{2} \cdot sz_k}{\left(1 - \frac{T}{2} \cdot sz_k\right)}$$

and $$poles = zp_K := \frac{1 + \frac{T}{2} \cdot sz_k}{\left(1 - \frac{T}{2} \cdot sp_k\right)}$$

where, $sz_k$ and $sp_k$ are zeros and poles, respectively, of a continuous-time transfer functions and where $$zz = \begin{bmatrix} 0.99897218 + 0.045327524i \\ 0.999823579 + 0.018783272i \\ 0.999823579 - 0.018783272i \\ 0.99897218 - 0.045327524i \end{bmatrix}$$

and $$zp = \begin{bmatrix} 0.822884455 + 0.290464849i \\ 0.704668491 + 0.102984636i \\ 0.704668491 - 0.102984636i \\ 0.822884455 - 0.290464849i \end{bmatrix}.$$

7. The 1-bit noise shaper circuit of claim 2, wherein scaling factors $K_{1-4}$ and feedback coefficients $B_{1-2}$ have the following values:
$k_1=0.25$, $k_2=0.5$, $k_3=0.25$, and $k_4=0.5$; and
$B_1=-0.016470516$, $B_2=-0.002823487$.

8. A noise shaping circuit of the type having a multi-bit digital input signal and a 1-bit output signal, comprising:
   (a) a first summing node, having a plurality of inputs and an output, wherein one input of said first summing node is connected to said multi-bit digital input signal and another input of said first summing node is connected to a first feedback signal path;
   (b) a first integrator, having an output and having an input connected to said first summing node output;
   (c) a second summing node, having a plurality of inputs and an output, wherein said output of said first integrator is connected to one said input of said second summing node and a second feedback signal path is connected to another said input of said second summing node;
   (d) a second integrator, having an input and an output, wherein said input is connected to said output of said second summing node;
   (e) a third summing node, having a plurality of inputs and an output, wherein said output of said second integrator is connected to one of said inputs of said third summing node and another of said inputs of said third summing node is connected to a third feedback signal path;
   (f) a third integrator, having an input and an output wherein said input of said third integrator is connected to said output of said third summing node;
   (g) a fourth summing node, having a plurality of inputs and an output, whereby one input of said fourth summing node is connected to said output of said third integrator and another input of said fourth summing node is connected to a fourth feedback signal path;
   (h) a fourth integrator, having an input and an output, wherein said input of said fourth integrator is connected to said output of said fourth summing node; and
   (i) a quantizer, having an input and an output, wherein said input is connected to said output of said fourth integrator, and wherein a 1-bit digital output signal is provided at said quantizer output.

9. A method of converting a multi-bit digital input signal to a 1-bit digital output signal, comprising the steps of:
   (a) providing a multi-bit digital input signal to the input of a fourth order sigma-delta modulator, wherein said fourth order modulator includes a quantizer and a plurality of integrators, wherein each said integrator includes an input, wherein said fourth order modulator further includes a plurality of feedback paths, wherein each such feedback path provides a 1 bit feedback signal which is a output from said quantizer, and wherein said input of each said integrator is connected to a separate one of said feedback paths; and
   (b) converting said multi-bit digital input signal to a 1-bit digital output signal using said fourth order modulator.

10. A 1-bit noise shaper circuit for a digital-to-analog conversion circuit, comprising:
    a sigma-delta modulator network including a quantizer and a plurality of feedback paths, wherein each such feedback path provides a 1-bit feedback signal which is output from said quantizer, wherein said modulator network further includes a plurality of integrator, wherein each said integrator has an input, wherein the input of each said integrator is connected to a separate one of said feedback paths, and wherein a plurality of multi-bit digital signals are input to said noise shaper circuit and are converted to a respective 1-bit digital output signal.

11. The 1-bit noise shaper circuit of claim 10, wherein said sigma-delta modulator comprises a fourth order network.

12. The noise shaping circuit of claim 8, further comprising:
    (a) A first multiplier with an input and an output, wherein the input is connected to the said quantizer output, and wherein the output is connected to said first feedback signal path;
    (b) A second multiplier with an input and an output, wherein the input is connected to the said quantizer output, and wherein the output is connected to said second feedback signal path;
    (c) A third multiplier with an input and an output, wherein the input is connected to the said quantizer output, and wherein the output is connected to said third feedback signal path;
    (d) A forth multiplier with an input and an output, wherein the input is connected to the said quantizer output, and wherein the output is connected to said forth feedback signal path.

* * * * *